(12) United States Patent
Sato et al.

(10) Patent No.: US 8,299,452 B2
(45) Date of Patent: Oct. 30, 2012

(54) METHOD FOR FABRICATION OF SEMIPOLAR (AL, IN, GA, B)N BASED LIGHT EMITTING DIODES

(75) Inventors: Hitoshi Sato, Kanagawa (JP); Hirohiko Hirasawa, Niigata (JP); Roy B. Chung, Goleta, CA (US); Steven P. DenBaars, Goleta, CA (US); James S. Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/405,590

(22) Filed: Feb. 27, 2012

(65) Prior Publication Data

US 2012/0205620 A1 Aug. 16, 2012

Related U.S. Application Data

(63) Continuation of application No. 12/419,119, filed on Apr. 6, 2009, now Pat. No. 8,148,713.

(60) Provisional application No. 61/042,644, filed on Apr. 4, 2008.

(51) Int. Cl.
*H01L 29/06* (2006.01)

(52) U.S. Cl. ....... 257/13; 257/14; 257/90; 257/E33.002; 257/E21.002; 438/28; 977/755

(58) Field of Classification Search ............... 257/13, 257/14, 90, E33.009, E33.002, E21.002; 438/28; 977/755

See application file for complete search history.

(56) References Cited

U.S. PATENT DOCUMENTS

| 2006/0205199 A1 | 9/2006 | Baker et al. |
| 2007/0102721 A1 | 5/2007 | DenBaars et al. |
| 2007/0131961 A1 | 6/2007 | Krames et al. |

OTHER PUBLICATIONS

Funato, M. et al., "Blue, green, and amber InGaN/GaN light-emitting diodes on semipolar {11-22} GaN bulk substrates," Japanese Journal of Applied Physics, vol. 45, No. 26, 2006, p. L659.
Sato, H. et al., "High power and high efficiency green light emitting diode on free-standing semipolar (1122) bulk GaN substrate," Phys. Stat. Sol., vol. 1, No. 4, 2007, pp. 162-164.
Sato, H. et al., "Optical properties of yellow light-emitting diodes grown on semipolar (1122) bulk GaN substrates," Applied Physics Letters 92, 2008, pp. 221110-1-221110-3.
Sharma, R. et al., "Demonstration of semipolar (1013) InGaN/GaN green light emitting diode," Applied Physics Letters 87, 2005, pp. 231110-1-231110-3.
Zhong, H. et al., "Demonstration of high power blue-green light emitting diode on semipolar (1122) bulk GaN substrate," Electronics Letters, vol. 43, No. 15, Jul. 19, 2007, pp. 825-827.
Zhong, H. et al., "High power and high efficiency blue light emitting diode on freestanding semipolar (1011) bulk GaN substrate," Applied Physics Letters 90, 2007, pp. 233504-1-233504-3.
International Search Report mailed May 28, 2009, International application No. PCT/US09/39667, International filing Apr. 6, 2009.

*Primary Examiner* — Jami M Valentine
(74) *Attorney, Agent, or Firm* — Gates & Cooper LLP

(57) ABSTRACT

A yellow Light Emitting Diode (LED) with a peak emission wavelength in the range 560-580 nm is disclosed. The LED is grown on one or more III-nitride-based semipolar planes and an active layer of the LED is composed of indium (In) containing single or multi-quantum well structures. The LED quantum wells have a thickness in the range 2-7 nm. A multi-color LED or white LED comprised of at least one semipolar yellow LED is also disclosed.

21 Claims, 10 Drawing Sheets

METHOD FOR FABRICATION OF SEMIPOLAR (AL, IN, GA, B)N BASED LIGHT EMITTING DIODES

CROSS REFERENCE TO RELATED APPLICATIONS

This application is a continuation of and claims the benefit under 35 U.S.C. Section 120 of commonly-assigned U.S. application Ser. No. 12/419,119, filed on Apr. 6, 2009 now U.S. Pat. No. 8,148,713, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES," which application claims the benefit under 35 U.S.C. Section 119(e) of commonly-assigned U.S. Provisional Patent Application Ser. No. 61/042,644, filed on Apr. 4, 2008, by Hitoshi Sato, Hirohiko Hirasawa, Roy B. Chung, Steven P. DenBaars, James S. Speck and Shuji Nakamura, entitled "METHOD FOR FABRICATION OF SEMIPOLAR (Al,In,Ga,B)N BASED LIGHT EMITTING DIODES,"

which applications are incorporated by reference herein.

This application is related to the following co-pending and commonly-assigned applications:

U.S. patent application Ser. No. 12/419,128, filed on same date herewith, by Hitoshi Sato, Roy B. Chung, Feng Wu, James S. Speck, Steven P. DenBaars and Shuji Nakamura, entitled "MOCVD GROWTH TECHNIQUE FOR PLANAR SEMIPOLAR (Al, In, Ga, B)N BASED LIGHT EMITTING DIODES," which application claims the benefit under 35 U.S.C. Section 119(e) of U.S. Provisional Application Ser. No. 61/042,639, filed on Apr. 4, 2008, by Hitoshi Sato, Roy B. Chung, Feng Wu, James S. Speck, Steven P. DenBaars and Shuji Nakamura, entitled "MOCVD GROWTH TECHNIQUE FOR PLANAR SEMIPOLAR (Al, In, Ga, B)N BASED LIGHT EMITTING DIODES," and U.S. patent application Ser. No. 11/840,057, filed on Aug. 16, 2007, by Michael Iza, Hitoshi Sato, Steven P. Denbaars and Shuji Nakamura, entitled "METHOD FOR DEPOSITION OF MAGNESIUM DOPED (Al, In, Ga, B)N LAYERS," now U.S. Pat. No. 7,709,284, issued May 4, 2010, which application claims the benefit under 35 U.S.C. Section 119(e) of U.S. Provisional Application Ser. No. 60/822,600, filed on Aug. 16, 2006, by Michael Iza, Hitoshi Sato, Steven P. Denbaars and Shuji Nakamura, entitled "METHOD FOR DEPOSITION OF MAGNESIUM DOPED (Al, In, Ga, B)N LAYERS,"

which applications are incorporated by reference herein.

BACKGROUND OF THE INVENTION

1. Field of the Invention

This invention relates to yellow light emitting diodes (LEDs) and methods of fabricating the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Current nitride technology for electronic and optoelectronic devices employs nitride films grown along the polar c-direction. However, conventional c-plane quantum well (QW) structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN optoelectronic devices is to grow the devices on nonpolar planes of the crystal. Such planes contain equal numbers of Ga and N atoms and are charge-neutral. Furthermore, subsequent nonpolar layers are crystallographically equivalent to one another so the crystal will not be polarized along the growth direction. Two such families of symmetry-equivalent nonpolar planes in GaN are the {11-20} family, known collectively as a-planes, and the {1-100} family, known collectively as m-planes. Unfortunately, despite advances made by researchers at the University of California at Santa Barbara (UCSB), growth of nonpolar nitrides remains challenging and has not yet been widely adopted in the III-nitride industry.

Another approach to reducing, or possibly eliminating, the polarization effects in GaN optoelectronic devices, is to grow the devices on semipolar planes of the crystal. The term semipolar planes can be used to refer to a wide variety of planes that possess two nonzero h, i, or k Miller indices, and a nonzero l Miller index. Some commonly observed examples of semipolar planes in c-plane GaN heteroepitaxy include the {11-22}, {10-11}, and {10-13} planes, which are found in the facets of pits. These planes also happen to be the same planes that the authors have grown in the form of planar films. Other examples of semipolar planes in the wurtzite crystal structure include, but are not limited to, {10-12}, {20-21}, and {10-14} planes. The nitride crystal's polarization vector lies neither within such planes or normal to such planes, but rather lies at some angle inclined relative to the plane's surface normal. For example, the {10-11} and {10-13} planes are at 62.98° and 32.06° to the c-plane, respectively.

In addition to spontaneous polarization, the second form of polarization present in nitrides is piezoelectric polarization. This occurs when the material experiences a compressive or tensile strain, as can occur when (Al, In, Ga, B)N layers of dissimilar composition (and therefore different lattice constants) are grown in a nitride heterostructure. For example, a thin AlGaN layer on a GaN template will have in-plane tensile strain, and a thin InGaN layer on a GaN template will have in-plane compressive strain, both due to lattice mismatching to the GaN. Therefore, for an InGaN QW on GaN, the piezoelectric polarization will point in the opposite direction to the spontaneous polarization of the InGaN and GaN. For an AlGaN layer latticed matched to GaN, the piezoelectric polarization will point in the same direction as the spontaneous polarization of the AlGaN and GaN.

The advantage of using semipolar planes over c-plane nitrides is that the total polarization will be reduced. There may even be zero polarization for specific alloy compositions on specific planes. Such scenarios will be discussed in detail in future scientific papers. The important point is that the polarization will be reduced as compared to the polarization of c-plane nitride structures. A reduced polarization field allows growth of a thicker QW. Hence, higher Indium (In) composition and thus longer wavelength emission, can be achieved. Many efforts have been made in order to fabricate semipolar/nonpolar based nitride LEDs in longer wavelength emission regimes [1-6].

This disclosure describes an invention allowing for fabrication of blue, green, and yellow LEDs on semipolar (Al, In, Ga, B)N semiconductor crystals. Although longer wavelength emission from LEDs has been reported from AlInGaP material systems, there have been no successful developments of yellow LEDs emitting in the range of 560 nm-570 nm wavelength in both nitrides and phosphides.

SUMMARY OF THE INVENTION

To overcome the limitations in the prior art described above, and to overcome other limitations that will become apparent upon reading and understanding the present specification, the present invention discloses at least one yellow, amber or red LED, grown on at least one III-nitride-based semipolar plane, with a peak emission wavelength longer than 560 nanometers (nm) and an output power of more than 3.5 milliwatts (mW) at a current of 20 milliamps (mA).

The LED typically comprises an active layer for emitting light, wherein the semipolar plane enables a thickness of the active layer that is sufficiently thick, an Indium (In) composition of the active layer that is sufficiently high, and a crystal quality of the active layer that is sufficiently high, so that the light has the peak emission wavelength longer than 560 nm and the output power of more than 3.5 mW at a current of 20 mA. The active layer typically comprises In containing single quantum well (SQW) or multi-quantum well (MQW) structures comprising at least one QW, and the QW has the crystal quality sufficiently high to obtain the output power of more than 3.5 mW at the current of 20 mA. In one example, the QW has the thickness in a range from 2 nm to 7 nm and/or the crystal quality is a Threading Dislocation (TD) density of $9 \times 10^9$ cm$^{-2}$ or less.

The present invention further discloses a multi-color LED device, for emitting multi-colored light, comprised of a yellow, amber, or red light emitting LED (e.g., semipolar yellow LED grown on a semipolar plane), and a white LED device, for emitting white light, comprised of a yellow, amber, or red light emitting LED (e.g., semipolar yellow LED grown on a semipolar plane). The semipolar yellow LED may be a III-nitride based LED grown on a {11-22} semipolar plane, for example.

The present invention further discloses a white LED device comprised of a blue light emitting QW and a yellow light emitting QW grown on one or more III-nitride based semipolar planes. Typically, the white LED device comprises MQWs that are comprised of the blue-light emitting QW that is a first InGaN QW, with a first In composition for emitting blue light, and the yellow-light emitting QW that is a second InGaN QW, with a second In composition for emitting yellow light.

The present invention further discloses a method of fabricating the yellow, amber, or red LED, by growth on at least one III-nitride based semipolar plane, so that the LED emits light with a peak emission wavelength longer than 560 nm and an output power of more than 3.5 mW at a current of 20 mA. The present invention also discloses a method of fabricating a white LED device emitting white light, comprising growing blue-light emitting quantum wells and yellow-light emitting quantum wells on one or more III-nitride based semipolar planes. In addition, the present invention discloses a method of emitting white light from an LED, comprising emitting blue light and from blue-light emitting quantum wells and yellow light from yellow-light emitting quantum wells, wherein the blue light emitting quantum wells and the yellow light emitting quantum wells are grown on one or more III-nitride based semipolar planes.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a method for fabrication of blue, green, yellow, white, and other color LEDs with a bulk semipolar GaN substrate such as {10-1-1}, {11-22}, and other planes. Semipolar (Al, In, Ga, B)N semiconductor crystals allow the fabrication of a multilayer structure with zero, or reduced, internal electric fields resulting from internal polarization discontinuities within the structure, as described in previous disclosures. This invention describes the first yellow LEDs in III-nitride based optoelectronics. Further, the invention incorporates a low temperature growth of n-type GaN resulting in improvement of film quality. The use of a semipolar (Al, In, Ga, B)N semiconductor orientation results in reduced internal electric field, and thus a thicker QW and higher In composition for longer wavelength emissions relative to [0001] nitride semiconductors. The invention of yellow LEDs allows the fabrication of high power white LEDs.

Technical Description

Process Steps

Figure 1:
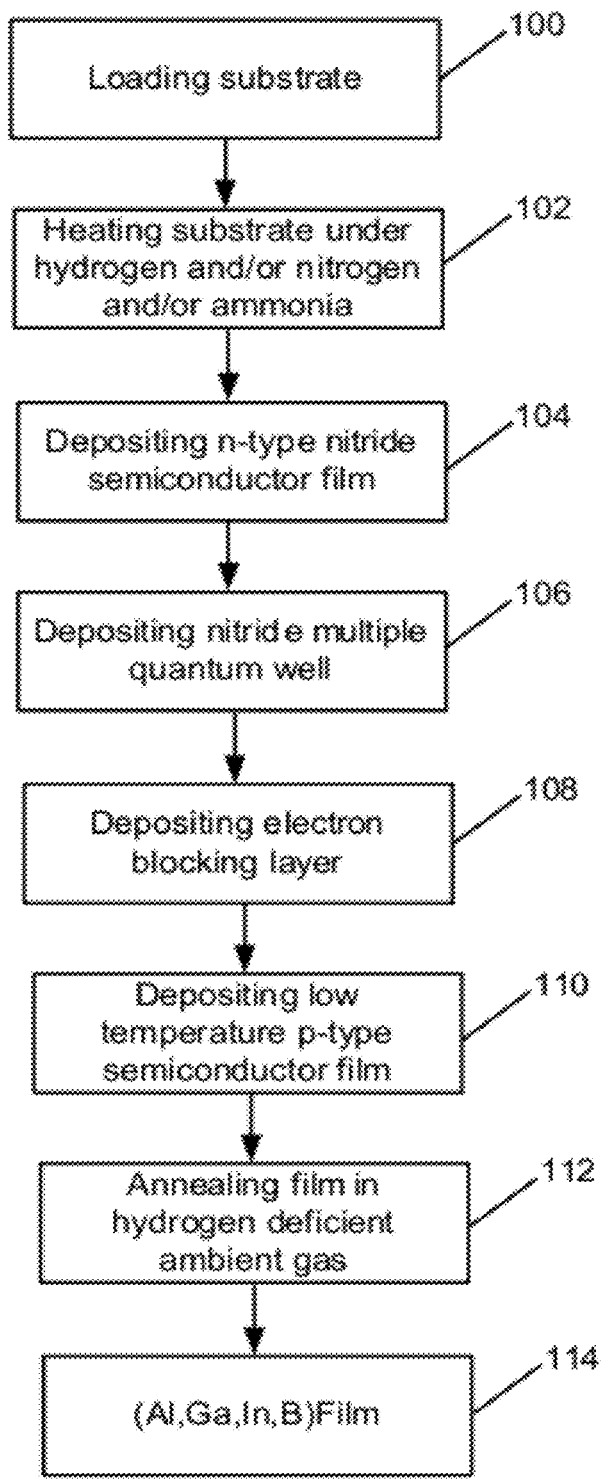
FIG. 1 is a flowchart of a growth process for semipolar GaN thin films according to the present invention.

The present invention describes a method for growth of semipolar {10-1-1} and {11-22} GaN via metalorganic vapor deposition (MOCVD), and fabrication of yellow LEDs. FIG. 1 is a flowchart that illustrates the steps of a MOCVD growth process for semipolar GaN thin films on a {10-1-1} or {11-22} bulk GaN substrate, according to an embodiment of the present invention that is described in the following paragraphs.

Block 100 represents loading a substrate into a reactor. For example, for the growth of a semipolar LED structure, a bulk {10-1-1} or {11-22} GaN substrate, is loaded into a MOCVD reactor.

Block 102 represents heating the substrate under hydrogen and/or nitrogen and/or ammonia ambient. The reactor's heater is turned on and ramped to a set point temperature, to heat the substrate under hydrogen and/or nitrogen ambient. Generally, nitrogen and/or hydrogen flow over the substrate at atmospheric pressure.

Block 104 represents depositing an n-type nitride semiconductor film/layer (in this case n-type GaN) on the substrate. After the heating step of block 102, the temperature is set to 1100° C., and 54 mmol/minute (micro-mole per minute) of trimethyl-gallium (TMGa) is introduced into the reactor with DiSilane for 30 minutes to initiate the growth of n-type GaN. 4 slm (standard liters per minute) of ammonia ($NH_3$) is also introduced at this stage and it is kept at the same level until the end of the growth.

Block 106 represents depositing a nitride MQW on the n-type nitride layer. Once the desired n-type GaN thickness of block 104 is achieved, the reactor's temperature set point is decreased to 815° C., and 6.9 mmol/minute of Triethylgallium (TEGa) is introduced into the reactor and a 20 nm thick GaN barrier layer is grown. Once the desired thickness of GaN barrier is achieved, 10.9 mmol/minute trimethyl-indium (TMIn) is introduced into the reactor to deposit a 3 nm thick InGaN SQW. After the deposition of the InGaN layer, 6.9 mmol/minute of TEGa is again introduced into the reactor for growth of GaN to finalize the QW structure. This step can be repeated several times to form a MQW.

Block 108 represents depositing an electron blocking layer. Once the SQW/MQW is deposited, 3.6 mmol/minute of TMGa, 0.7 mmol/minute of trimethyl-aluminum (TMAl), and $2.36 \times 10^{-2}$ mmol/minute of $Cp_2Mg$ are introduced into the reactor in order to form a 10 nm-thick AlGaN electron blocking layer which is slightly doped with Mg.

Block 110 represents depositing a low temperature nitride p-type semiconductor film on the SQW/MQW. Once a desired AlGaN thickness is achieved in block 108, the reactor's set point temperature is maintained at 820° C. for 10 minutes. For the first 3 minutes of this interval, 12.6 mmol/minute of TMGa and $9.8 \times 10^{-2}$ mmol/minute of $Cp_2Mg$ are introduced into the reactor. For the last 7 minutes, the flow of $Cp_2Mg$ is doubled. Then, the temperature is ramped to 875° C. in 1 minute, and TMGa flow is kept constant and $Cp_2Mg$ is reduced back to $9.8 \times 10^{-2}$ mmol/minute during this ramp time. The growth of p-GaN is continued at 875° C. for another 1 minute.

Block 112 represents annealing the film (specifically, the p-GaN) in a hydrogen deficient ambient gas. Once the reactor has cooled, the nitride diode structure formed in blocks 100-110 is removed and annealed in a hydrogen deficient ambient for 15 minutes at a temperature of 700° C. in order to activate the Mg doped GaN (p-GaN).

Block 114 represents the end result of the method, an (Al,Ga,In,B)N diode film with longer wavelength emission, wherein the layers grown in blocks 104-110 are typically grown in a semipolar orientation, for example by growing on a semipolar plane of the substrate of block 100. For example, this method can be used to fabricate a yellow, amber, or red LED, comprising growing the LED on at least one III-nitride-based semipolar plane, so that the LED emits light with a peak emission wavelength longer than 560 nm and an output power of more than 3.5 mW at a current of 20 mA. Typically, the semipolar plane enables a thickness of the active layer that is sufficiently thick, an Indium (In) composition of the active layer that is sufficiently high, and a crystal quality of the active layer that is sufficiently high, so that the light has the peak emission wavelength longer than 560 nm and the output power of more than 3.5 mW at a current of 20 mA. The crystal quality may be a dislocation density (e.g., TD) of $9 \times 10^9$ cm$^{-2}$ or less, for example. The quantum well may have the thickness in a range from 2 nm to 7 nm, for example.

This method can also be used to fabricate a white LED device emitting white light, comprising growing blue-light and yellow-light emitting QWs on one or more III-nitride based semipolar planes.

After finishing the growth, the semipolar GaN of block 114 is processed into an LED. First, 2000 Angstrom (Å) to 2500 Å thick Indium Tin Oxide (ITO) is deposited, on the p-GaN of block 110, by an electron-beam evaporator for a p-type contact. ITO has higher transparency, of more than 90% for wavelengths of light between 350 nm to 800 nm, in comparison with conventional metal p-type contacts (such as Nickel (Ni)/Gold(Au), or Ni/Au, which has transparency of about 40% in the same wavelength range). Higher light extraction is expected with the ITO contact.

Once the ITO is deposited, a mesa is formed in the film of block 114 by dry-etching techniques, using $Cl_2$ gas for 1 to 3 minutes to expose the n-type GaN. Then, the ITO layer is annealed under $N_2$ and $O_2$ ambient, at a temperature of 500° C. to 700° C. for 5 to 10 minutes, to make the ITO become transparent. In order to form an ohmic contact to the n-type GaN layer (n-contact), metal contacts with Titanium (Ti), Aluminum (Al), Ni, and Au layers are deposited by e-beam evaporator on the n-GaN layer. N-contacts are also annealed under $N_2$ ambient, at a temperature of 300° C.-500° C. for 3-5 minutes. The final step of LED fabrication is to deposit a 3000 Å to 6000 Å thick Au layer by e-beam evaporation, on the n-contact and ITO for packaging purposes.

Advantages and Improvements

Figure 2:
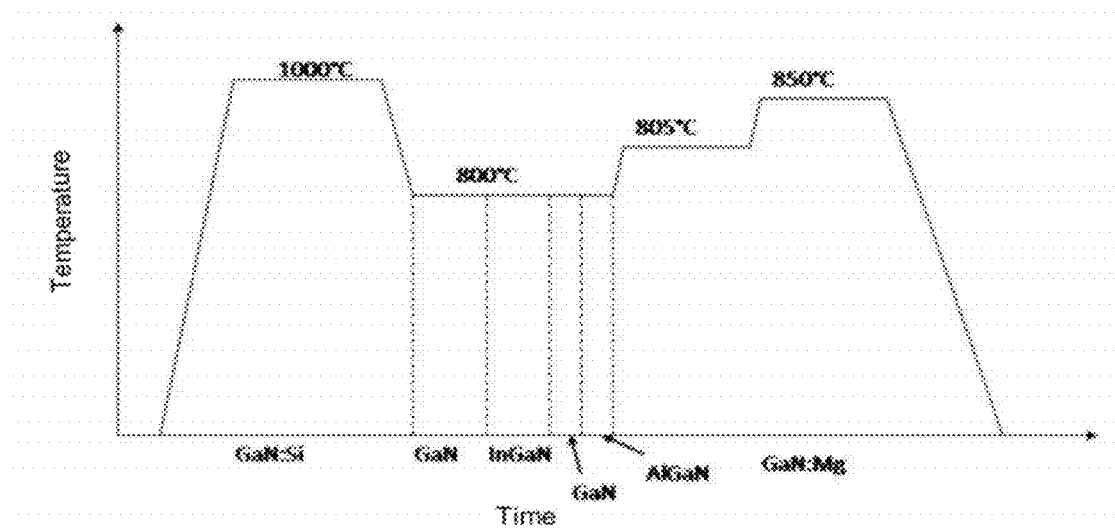
FIG. 2 is a temperature profile (temperature vs. time) for the deposition of nitride based diode device layers containing InGaN MQWs, or a SQW, according to an embodiment of the present invention.

The existing practice is to grow GaN with the c-plane parallel to the surface. There are several salient points that are advantageous in the present invention in comparison with current c-plane nitride technology. FIG. 2 shows the temperature profile (temperature vs. time) for an embodiment of the present invention, showing growth of silicon doped GaN (GaN:Si) at 1000° C., followed by growth of a SQW structure at 800° C. (first GaN barrier layer, InGaN layer, and second GaN barrier layer), followed by growth of an AlGaN electron blocking layer at 800° C., followed by growth of Mg doped GaN (GaN:Mg) at 805° C. and 850° C.

Normally, n-GaN for a c-plane GaN film is typically deposited/grown at a temperature of 1050° C. FIG. 2, however, shows that the present invention deposits/grows n-type III-nitride (e.g., the n-GaN of block 104) at a low temperature, 10-50° C. lower than the temperature used for growth of c-plane III-nitride (e.g., GaN); therefore, low temperature grown n-GaN is employed as well as low temperature grown p-GaN. FIG. 2 also shows that the p-type III-nitride layer (e.g., p-GaN of block 110), on the MQWs, is grown at a temperature up to 250° C. lower than the temperature used for growth of c-plane III-nitride or GaN.

Current c-plane blue LEDs are grown using 3.9-8.6 μmol/minute of TMIn, yielding typical QW thicknesses of 2-2.5 nm. During the SQW deposition in the present invention (block 106), a higher flow rate of TMIn, 10.6 μmol/minute, and lower temperature (10-40° C. lower) are used, and a thicker QW is grown. Consequently, the In containing QWs or MQWs of block 106 are grown on the n-type layer to a thickness thicker than a thickness of c-plane nitride based light-emitting QW layer, at a faster growth rate than a growth rate used for growing the c-plane nitride based light-emitting QW layer, and/or a lower temperature (10-40° C. lower) than a temperature used to grow the c-plane nitride based light-emitting QW structure. The result is a higher InN composition and higher quality active region which allows longer wavelength emission.

Figure 3:
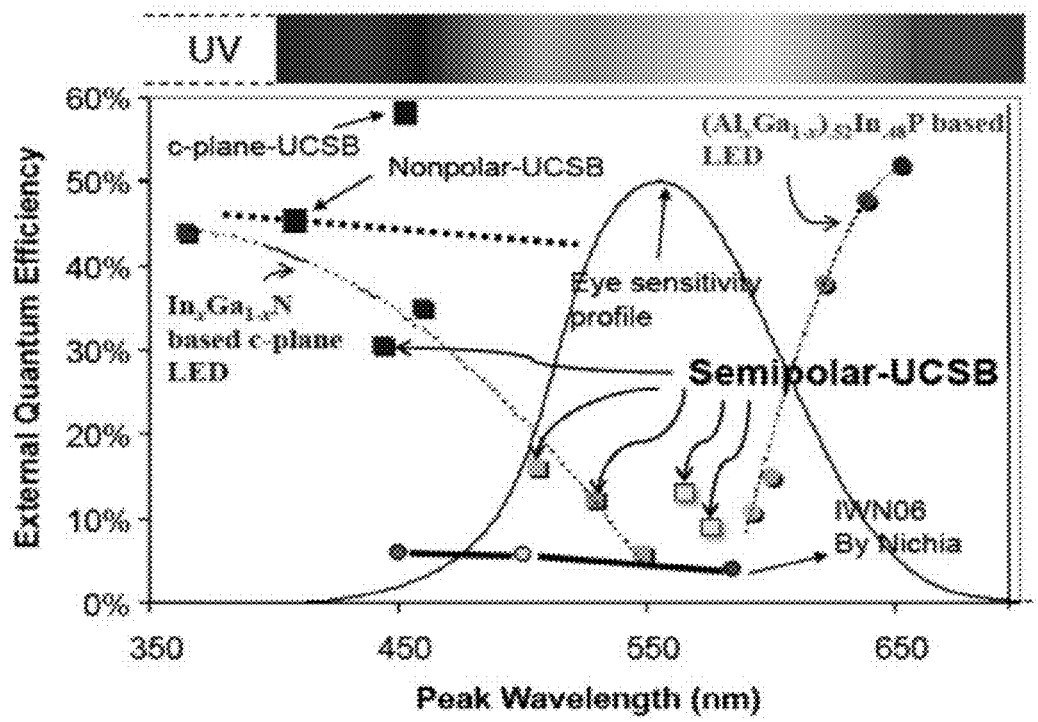
FIG. 3 is a graph of external quantum efficiency (EQE) vs. peak emission wavelength (nm), and current development status, for different materials systems using LED technology (c-plane UCSB, Nonpolar-UCSB, c-plane $In_xGa_{1-x}N$ (wherein $0 \leq x \leq 1$), Semipolar-UCSB, $(Al_xGa_{1-x})_{0.52}In_{0.48}P$, and International Workshop on Nitride Semiconductor (IWN) 2006 (IWN06) by Nichia LEDs, wherein the wavelength response of the human eye (eye sensitivity profile) is also shown.

The existing practice has not been able to produce yellow LEDs. FIG. 3 illustrates currently available LEDs' external quantum efficiency (EQE) with respect to peak wavelength emitted, for c-plane UCSB LEDs, nonpolar UCSB LEDs, c-plane InGaN LEDs, $(Al_xGa_{1-x})_{0.52}In_{0.48}P$ LEDs, and IWN06 by Nichia. Table 1 summarizes commercially available AlInGaP-based LEDs in the amber region. As can be seen from both FIG. 3 and Table 1, there have been no yellow LEDs emitting at peak wavelengths of 560 nm-580 nm, in either III-phosphide or In-nitride material systems. Red and amber LEDs have been produced by AlInGaP material systems for a while, and LEDs emitting light in the ultraviolet, blue, and green regions of the visible spectrum have been produced by (Al, In, Ga)N alloys (c-plane UCSB, nonpolar UCSB, and c-plane InGaN). However, prior to the present invention, no LEDs have ever been made in the yellow regions between 560 nm-580 nm wavelength in any material system.

For the first time, the present invention has achieved nitride LEDs emitting light at longer wavelength with output powers that are comparable to longer wavelength light emission from AlInGaP-based commercial LEDs (the present invention's LEDs, emitting 5.9 mW at 564 nm wavelength, and 3.5 mW at 575.7 nm wavelength, are indicated by "Semipolar-UCSB" in FIG. 3). For the LED emitting light of wavelength 564 nm, and the LED emitting light of wavelength 575.7 nm, the external quantum efficiencies are 13.4% and 8.2%, respectively [6]. As shown in FIG. 3, blue LEDs emitting light at 450 nm wavelength, and green LEDs emitting light at 520 nm wavelength (LEDs on semipolar planes), using either {11-22} and/or {10-11} planes, have been developed by UCSB.

TABLE 1

Performance of commercially available AlInGaP based LEDs at longer emission wavelengths, wherein TO-46 and 5s-PKG indicate packaging techniques that were employed.

| Peak wavelength | TO-46 | 5s-PKG |
| --- | --- | --- |
| 595 nm | 2.8 mW | 4.3 mW |
| 625 nm | 6.5 mW | >10 mW |
| 635 nm | >7 mW | >10 mW |
| 660 nm | >7 mW | >10 mW |

Figure 4A:
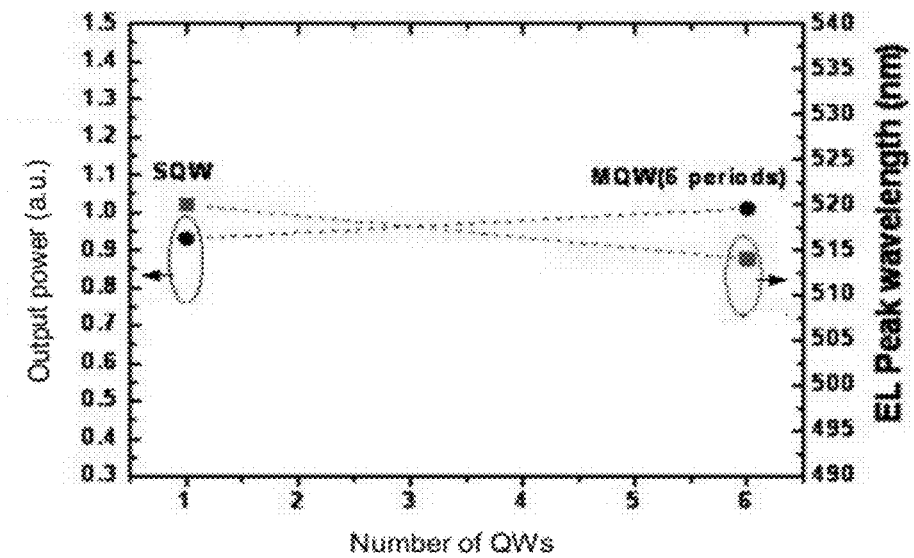
FIG. 4(a) is a graph plotting the dependence of output power (arbitrary units, a.u.) and Electroluminescence (EL) peak emission wavelength (nm), of EL from semipolar LEDs, on the number of QWs, or MQW periods, in the LED (for a SQW and MQW).

FIG. 4(a) shows the dependence of LEDs' output power and peak wavelength of emission on the number of QWs. The output power of the semipolar LEDs was evaluated by measuring the light output using a silicon photo detector through the back of the substrate. It is important to note that there is only a small shift in peak wavelengths and the output power change is within 0.1 mW indicating the high quality of QWs embodied by the growth conditions discussed earlier. Further, this result indicates more efficient growth, with less growth time, and thus InGaN's thermal budget can be greatly decreased. The present invention believes this is one of the reasons for successful fabrication of yellow LEDs.

Figure 4B:
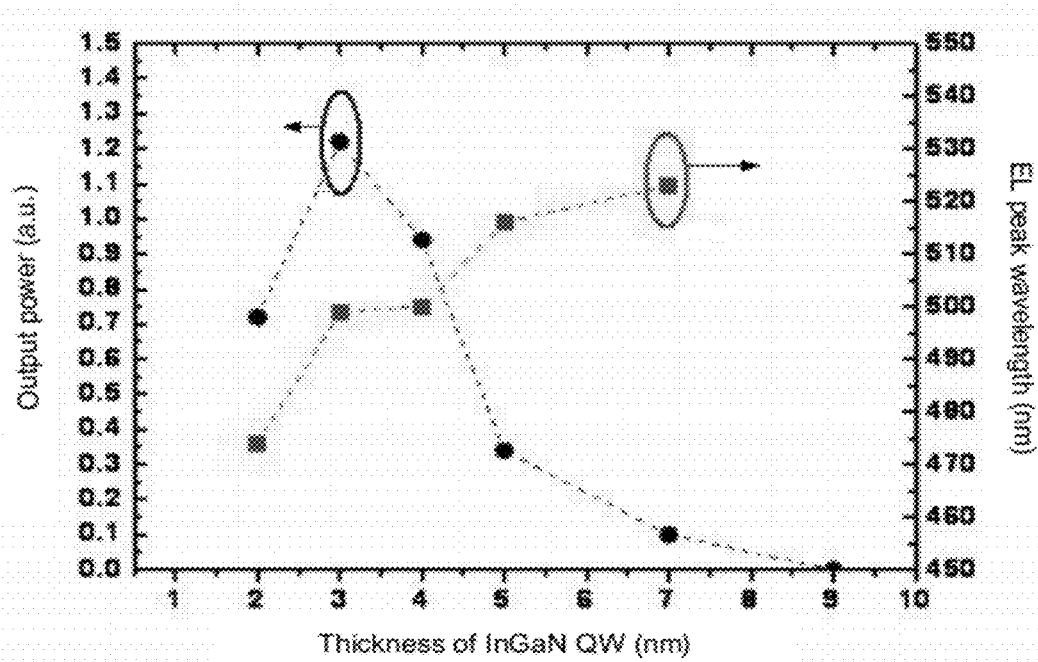
FIG. 4(b) is a graph plotting the dependence of output power (a.u.) and peak EL wavelength (nm), of EL from semipolar LEDs, on the thickness of the QWs (nm).
Figure 5A:
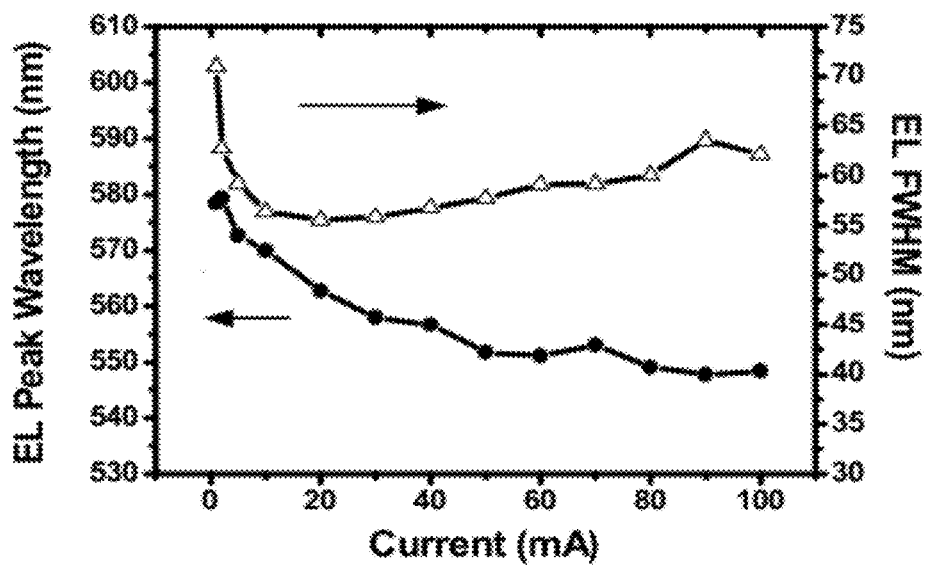
FIG. 5(a) plots EL peak emission wavelength (m, full circles) and EL full width at half maximum (FWHM) (m, open triangles) of a yellow LED grown on (11-22) GaN as a function of direct current (DC) currents from 1 mA to 100 mA.
Figure 5B:
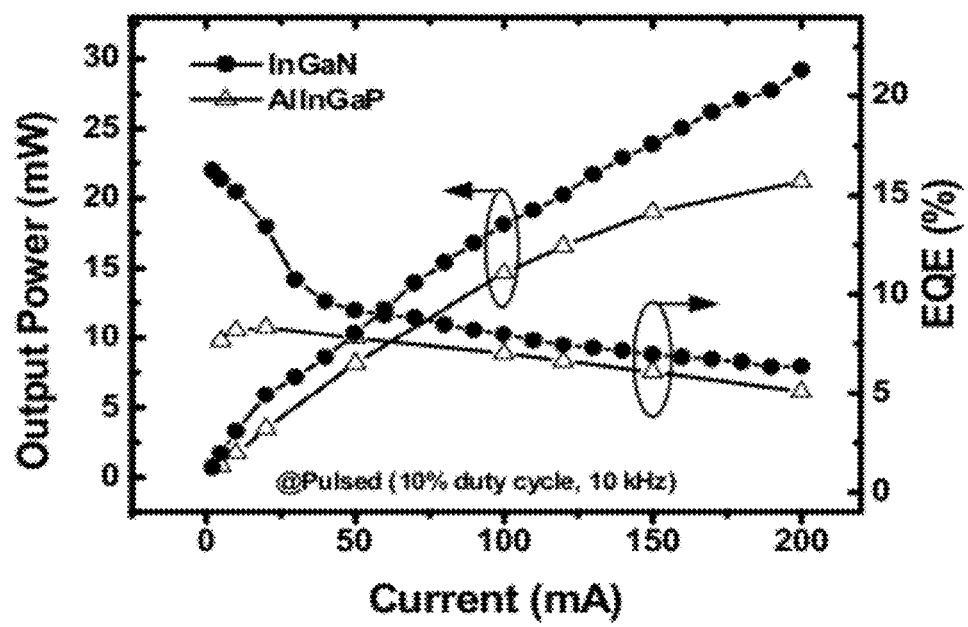
FIG. 5(b) plots output power (mW) and EQE (%) as a function of drive current (mA) for a yellow light emitting LED containing InGaN QWs (filled diamonds and circles) and on a semipolar plane, and an AlInGaP LED (hollow triangles), for pulsed currents at 10% duty cycle and at 10 KHz.

FIG. 4(b) describes the results of a set of experiments to observe the relationship between thickness of QWs and the output power and peak wavelengths emitted from the semipolar LEDs. Peak emission wavelength increases as thickness of the QW increases, as the indium composition in the active layer becomes higher. However, the output power, which is directly related to the efficiency of carrier recombination, shows an optimal thickness of 3 nm for this particular sample, and it drops quickly. This behavior is most likely due to poor crystal quality of the active layer with higher In composition. By combination of high quality QWs and an optimized QW thickness of 3 nm, the present invention was able to produce high power LEDs emitting light having a peak wavelength in the range 560 nm to 580 nm.

FIGS. 4(a), 4(b), 5(a) and 5(b) illustrate at least one yellow, amber or red LED, grown on at least one III-nitride-based semipolar plane, with a peak emission wavelength longer than 560 nm and an output power of more than 3.5 mW at a current of 20 mA. FIGS. 4(a), 4(b), 5(a), and 5(b) illustrate that the LEDs typically comprise an active layer for emitting light, wherein the semipolar plane enables a thickness of the active layer that is sufficiently thick, an In composition of the active layer that is sufficiently high, and a crystal quality of the active layer that is sufficiently high, so that the light has a peak emission wavelength longer than 560 nm and an output power of more than 3.5 mW at a current of 20 mA. In one embodiment, the LED has a 600×450 μm² mesa size, and the current density at 20 mA current is 20 mA/(600×450 μm²) =7.4 Amps per centimeter square.

LED Structures

Figure 6:
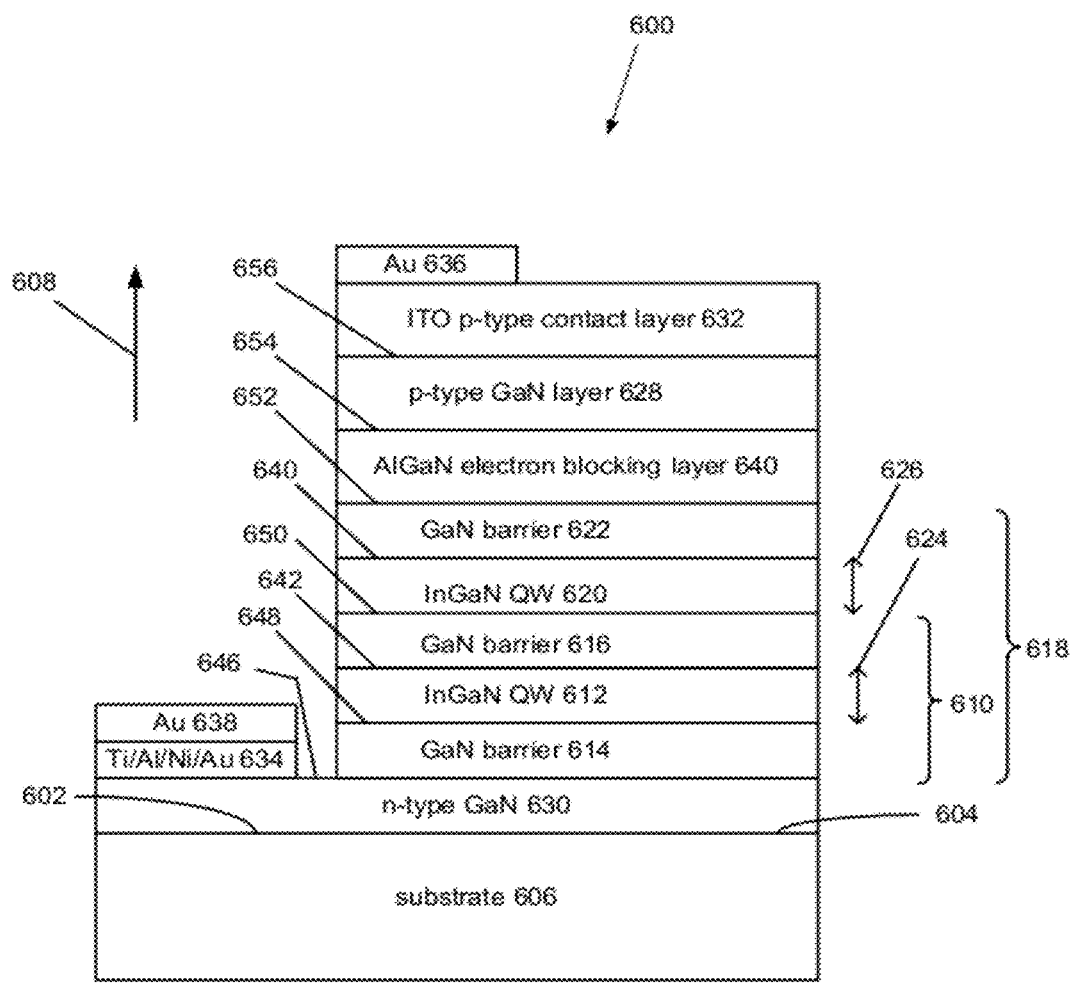
FIG. 6 is a cross-sectional schematic of a semipolar yellow, amber or red III-nitride based LED grown on a semipolar plane.

FIG. 6 also illustrates at least one yellow, amber or red LED 600, grown on at least one III-nitride-based semipolar plane 602, with a peak emission wavelength longer than 560 nm and an output power of more than 3.5 mW at a current of 20 mA. The semipolar plane 602 is a top surface 604 (or surface upon which subsequent layers are grown) of a GaN or III-nitride substrate 606 having a semi-polar orientation (e.g., grown in a semi-polar direction 608). The III-nitride based semipolar plane 602 may be a {11-22} or a {10-1-1} semipolar plane, for example, however, other semipolar planes are also possible.

The LED 600 comprises an active layer, and the active layer of the LED 600 is comprised of an In containing SQW structure 610 (comprising a QW 612, e.g., InGaN QW 612 between a GaN barrier layer 614 and a GaN barrier layer 616) or a MQW structure 618 (e.g., comprising a two period MQW structure 618 comprising the QW 612 and QW 620, e.g., InGaN QW 612 between GaN barrier layers 614 and 616 and InGaN QW layer 620 between GaN barrier layers 616 and 622, however the MQW structure 618 may comprise more than two periods so that the MQW structures comprise two or more QWs 612, 620). The QWs 612, 620 are for emitting light having the peak emission wavelength and the output power. The peak emission wavelength increases as an amount of In in the QWs 612, 620 increases; increasing a thickness 624 and 626 of the QWs 612 and 620 increases an amount of indium in the QWs 612 and 620. Therefore, the QWs 612 and 620 have the thickness 624 and 626 sufficiently thick, to obtain the amount of In sufficiently high to emit the light having the peak emission wavelength longer than 560 nm (e.g., amber, yellow or amber light). The QWs typically have the thickness 624 and 626 of 2 nm to 7 nm (i.e. thickness 624 and 626 are each 2 nm-7 nm thick). The QWs 612, 620 are thicker, and therefore can emit light having a longer wavelength, as compared to c-plane (Al,In,Ga,B)N based QWs. In one example, a number and/or thickness 624, 626 of QWs 612, 620 in the LED 600 can be selected to optimize (i.e. maximize) wavelength emission and output power, by choosing the thickness 624, 626 and number of QWs 612,620 corresponding to the intersection of the output power and EL peak wavelength curves in FIGS. 4(a) and 4(b).

The QW structure 610, or MQW structure 618, is between a p-type nitride (e.g., GaN) layer 628 and an n-type nitride (e.g., GaN) layer 630. The p-GaN 628 and n-GaN 630 provide holes and electrons, respectively, to the QWs 612, 620 so that the electrons and holes can re-combine in the QW 612 to emit light having a minimum photon energy corresponding to the bandgap energy of the QW 612. The amount of In incorporated in the QW 612 determines the bandgap of the QW, which in turn determines the minimum energy of the photons, and hence wavelength of the photons, emitted.

The LED 600 typically further comprises a p-type contact layer (e.g., ITO) 632 making ohmic contact to the p-type GaN layer 628 and a n-type contact layer (e.g., Ti/Al/Ni/Au) 634 making ohmic contact to the n-type GaN layer 630. An external power supply can supply current between, or voltage across, the p-contact layer 632 and n-contact layer 634, thus supplying the power necessary to drive the electrons and holes into the QW 612 such that the electrons and holes can re-combine to emit light. Metallization layers (e.g., Au) 636 and 638 may be on the p-contact layer 632 and n-contact layer 634 in order to improve electrical/mechanical contact between the LED 600 and the external power supply.

The LED 600 may also comprise an electron blocking layer 640 (e.g., AlGaN) between the barrier layer 622 and the p-type GaN layer 628.

Typically, layers 630, 610, 618, 640, and 628 are grown epitaxially on top of one another, along the direction 608, and on the substrate 606 (e.g., layer 630 on layer 606, layer 614 on layer 630, layer 612 on layer 614, layer 616 on layer 612, etc.). In such a way, QW layers 612 and 620 have a semipolar orientation, or a top surface 642 and 644, respectively, which has the semipolar orientation of the semipolar plane 602. Typically, n-type layer 630, barrier layer 614, barrier layer 616, barrier layer 622, blocking layer 640, and p-type layer 628, have a semi-polar orientation, or a top surface 646, 648, 650, 652, 654, and 656, respectively, which have the semipolar orientation of the semi-polar plane 602.

Figure 7:
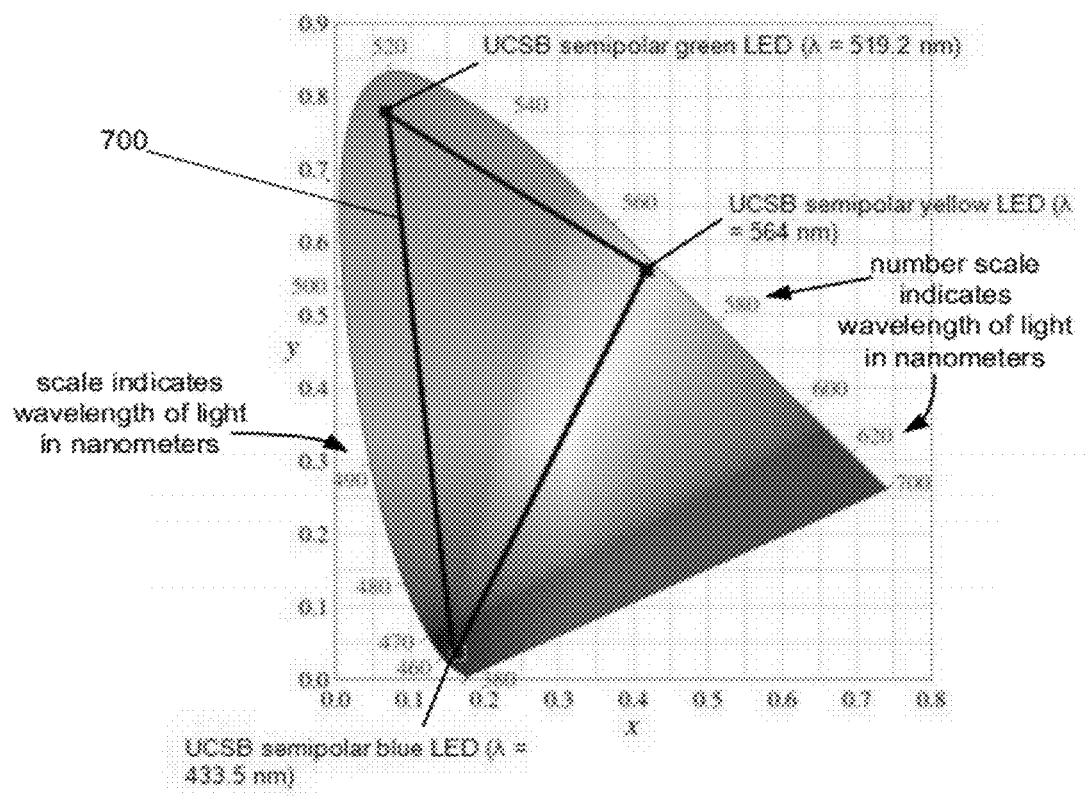
FIG. 7 is a Commission Internationale d'Eclairage (CIE) 1931 (x,y) chromaticity diagram, wherein the area within the triangle shows the possible colors that can be generated by combining UCSB semipolar blue, green and yellow LEDs, noting that actual coordinates of each LED may not correspond to the coordinates in FIG. 7, wherein the scale running along the perimeter of the triangle indicates the wavelength of light in nanometers (nm), corresponding to the color coordinates x,y.

Successful fabrication of a yellow LED has broadened the spectrum of semipolar based LEDs. The chromaticity diagram in FIG. 7 shows the possibility of multi-color LEDs fabricated on a semipolar GaN substrate. Current white LEDs are made using a YAG phosphor with 450 nm (blue) LEDs shining on the YAG phosphor. Even though this is the most commonly used technique for white LED fabrication, the biggest drawback of this technique is the 50% conversion loss in the phosphor film. The other method for producing white LEDs is to combine different colors of LEDs. As shown by FIG. 7, combining blue and yellow LEDs, it will be possible to fabricate high power and high efficiency white LEDs solely based on nitride technology. In addition, high power multi-color LEDs are now possible by combining blue, green, and yellow semipolar based Nitride LEDs, and red AlInGaP LEDs.

FIG. 7 shows that the invention of yellow LEDs now allows the creation of multi-color LEDs by combinations of blue, green, and yellow LEDs, and high power white LEDs can be realized by combining blue and yellow LEDs. As shown in FIG. 3, blue LEDs emitting light at 450 nm wavelength, and green LEDs emitting light at 520 nm wavelength (LEDs on semipolar planes), using either {11-22} and/or {10-11} planes, have been developed by UCSB [3,5]. The area within the triangle 700 in FIG. 7 shows the possible colors that can be generated by combining UCSB semipolar blue (e.g., emitting light of wavelength $\lambda$=433.5 nm), green (e.g., emitting light of $\lambda$=519.2 nm), and yellow (e.g., emitting light of wavelength $\lambda$=564 nm) LEDs. Thus, the multi-color LED device, emitting multiple colors of light, is comprised of the LED 600 (e.g., at least one III-nitride based semipolar yellow LED 600, grown on a III-nitride based semipolar plane 602, for example, a {11-22} plane, and emitting yellow light), and other nitride based (or non-nitride based) LEDs emitting blue, green, red, and/or other colored, light. Similarly, a white LED device, emitting white light, may be comprised of the LED 600 (e.g., at least one III-nitride based semipolar yellow LED 600, grown on a III-nitride based semipolar plane, for example, a {11-22} plane and emitting yellow light), and other nitride and non-nitride based LEDs emitting blue, green, red, and/or other colored light, so that the combination of the light emitted by the LEDs is white light. For example, the white light emitting LED device may comprise a blue light emitting LED and a yellow light emitting LED.

Figure 8:
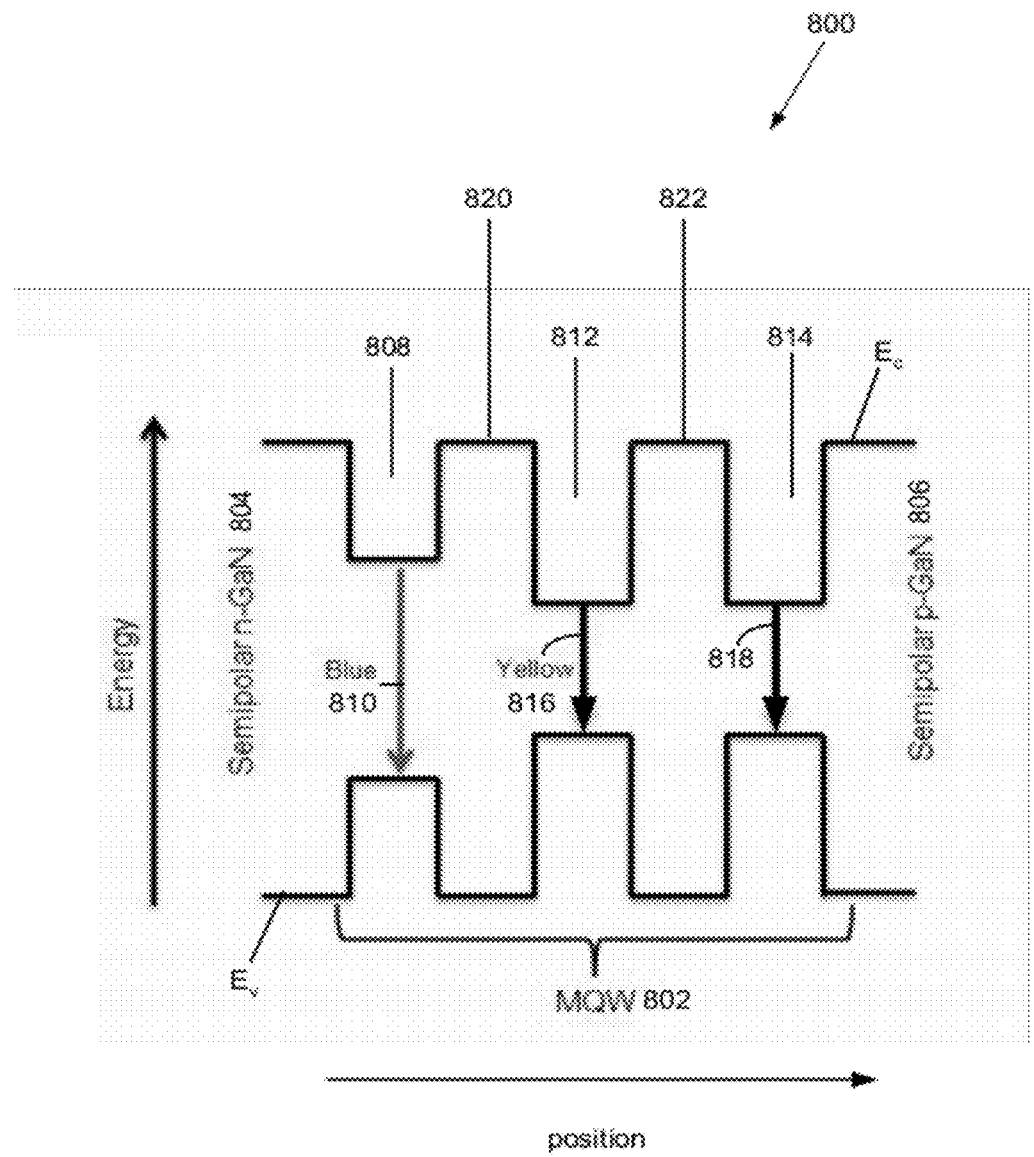
FIG. 8 is a schematic band structure for a white LED that can be made using QWs with two different bandgaps in a single structure, plotting energy as a function of position through the layers of the white LED.

Growth of high-quality QWs emitting in a broad range of the visible spectrum by one materials system, (Al, In, Ga, B)N, suggests another possible technology. Growth of InGaN active layers of different bandgap within a device can be employed to create a single white-LED structure. The band structure of such a white LED structure 800 is shown in FIG. 8, which illustrates the conduction band $E_c$, valence band $E_v$, MQW structure 802 between a semipolar n-type GaN (n-GaN) layer 804 and semipolar p-type GaN (p-GaN) layer 806, wherein the MQW structure 802 comprises a QW 808 (with an In composition x, e.g., $In_xGa_{1-x}N$) for emitting blue light 810, and QWs 812, 814 (with an In composition x, e.g., $In_xGa_{1-x}N$) for emitting yellow light 816, 818 and barrier layers 820, 822 (e.g. GaN). The band structure of QWs 808 is carefully designed so that dissociation of In in the blue-active-region 808 is minimal and there is higher hole injection for the yellow-active-region 812, 814. A SQW can be employed for the blue-active-region 808, and MQWs for yellow-active-regions 812, 814 to increase the efficiency of yellow emission 816, 818. With a flip-chip packaging technique and this band structure, a white LED can be realized on a single device. The blue light 810 is emitted with an energy equal to at least the bandgap energy $(E_c-E_v)$ in the QW 808, and the yellow light 816, 818 is emitted with an energy equal to at least the bandgap energy $(E_c-E_v)$ in the QWs 812, 814.

Figure 9:
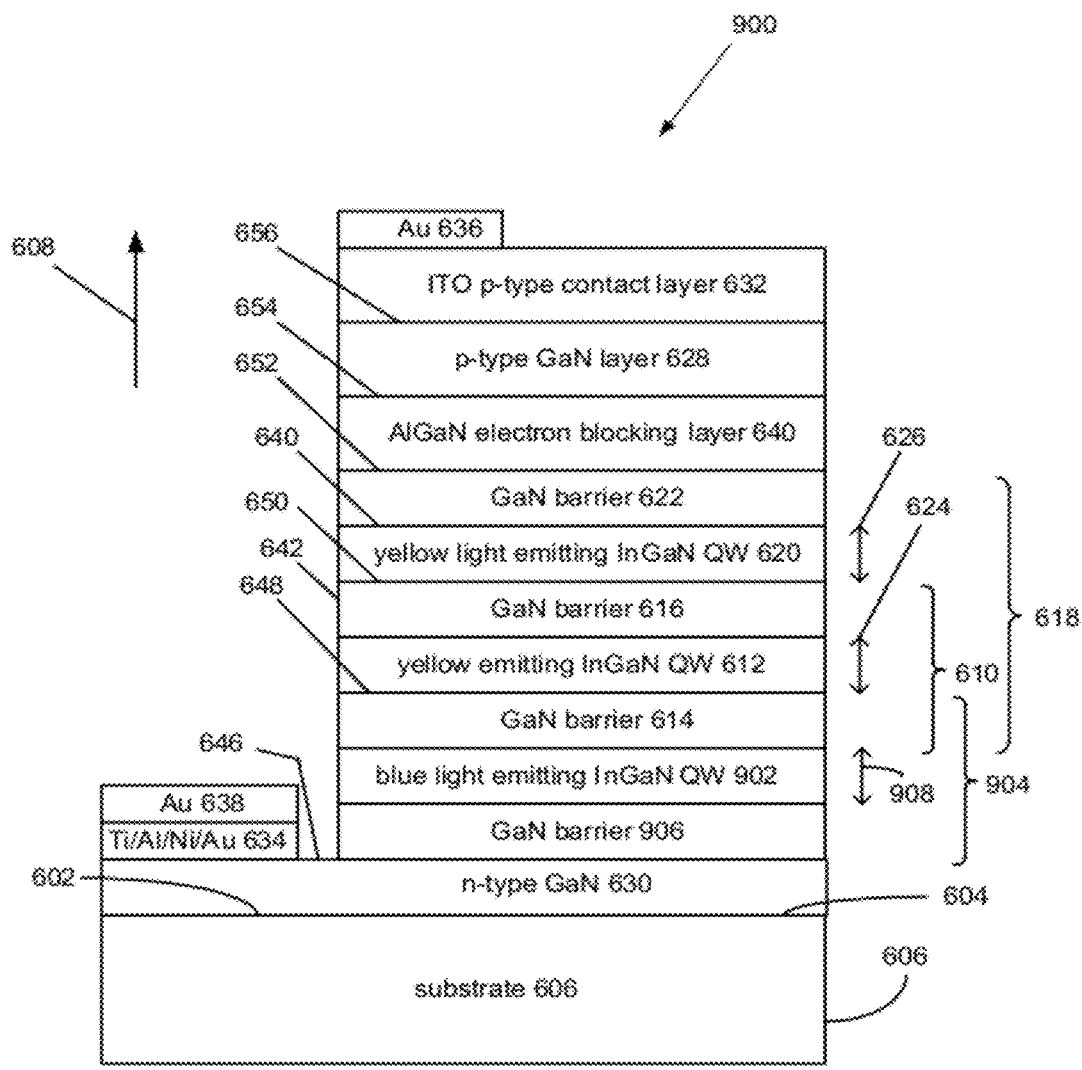
FIG. 9 is a cross-sectional schematic of a white LED comprised of one or more blue light emitting QWs and yellow light emitting QWs grown on one or more III-nitride based semipolar planes.

FIG. 9, which is based on FIG. 6, illustrates a white LED 900 comprised of one or more blue light emitting QWs 902 and one or more yellow light emitting QWs 612, 620 grown on one or more III-nitride based semipolar planes 602, in a single growth structure, for example. As such, the LED 900 comprises MQWs that are comprised of the blue-light emitting QW 902 and the yellow-light emitting QW 612. Typically, the blue-active-region 904 of the LED 900 comprises at least one blue-light emitting QW 902 for emitting blue light (e.g., a first InGaN QW with a first In composition and thickness 908 for emitting blue light), between a first GaN barrier layer 906 and a second GaN barrier layer 614; the yellow-active-region 610 comprises a yellow-light emitting QW 612 for emitting yellow light (e.g., a second InGaN QW with a second In composition and thickness 624, 626 for emitting yellow light), between the second GaN barrier layer 614 and a third GaN barrier layer 616; and the one or more III-nitride semipolar planes 602 are a surface 646, 604 of a III-nitride n-type layer 630 or substrate 606 (however, the semipolar planes 602 may be surfaces of other layers). The blue-active-region 904, and yellow-active-region 610, 618 are typically between the n-type layer 630 and p-type layer 628. As noted above, the yellow-active-region 618 is usually (but not limited to) a MQW structure and the layers 610, 904, 618, 640, 628, and 630 in FIG. 9 are typically grown epitaxially one on top of the other and have a semipolar orientation 608.

In the embodiments of FIG. 6 and FIG. 9, the In content, and thickness 624, 626, 908 of QWs 612, 620, and 902, determine the minimum bandgap of, and hence wavelength of light emitted, by the QWs 612, 620, and 902: in those examples, the In content and thickness 908 is selected such that active layer 902 emits blue light (or a wavelength corresponding to blue light) and the In content and thicknesses 624, 626 are selected such that active layers 612, 620 emit yellow, amber and/or red light (or a wavelength corresponding to yellow, amber, and/or red light). However, the blue-active-region 904 may be replaced with an active region emitting other colors of light, or additional active regions emitting other colors of light may be introduced/grown in between the n-type layer 630 and p-type layer 628, in order to obtain an LED device emitting multi-colors (multi-color LED device) or white light (white LED device). The active region emitting other colors of light requires QWs having an In incorporation x (in e.g., $In_xGa_{1-x}N$) and thickness that allows the QW to emit the other colors of light.

Figure 10:
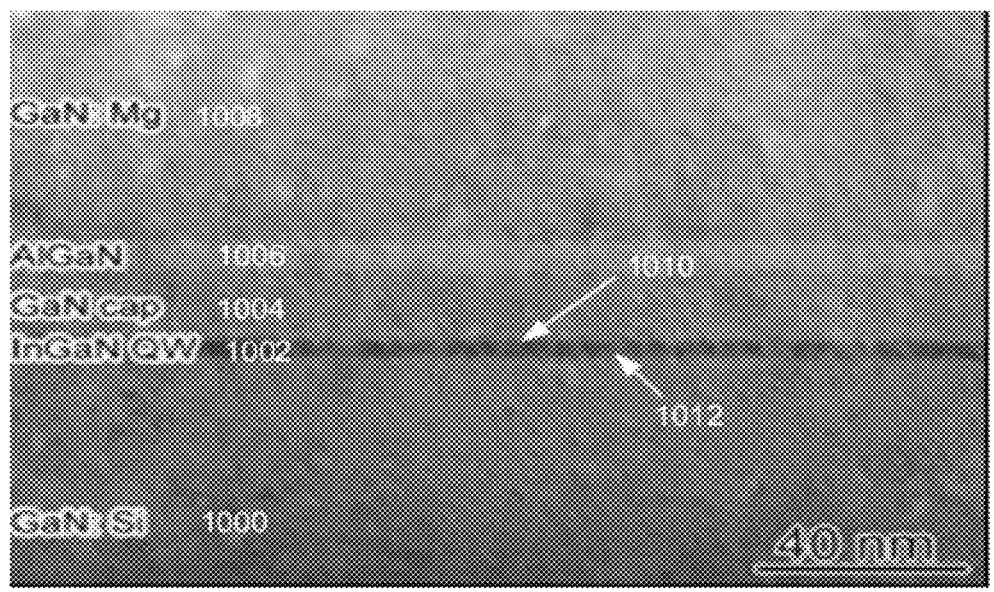
FIG. 10 is a transmission electron micrograph (TEM) image of a (11-22) yellow LED device in a [1-100] cross section, wherein the scale shows a distance of 40 nm.

FIG. 10 shows a representative cross-sectional TEM image of a semipolar InGaN QW structure on a (11-22) GaN substrate, showing n-type GaN:Si layer 1000, InGaN QW layer 1002 on the GaN:Si 1000, GaN cap layer 1004 on the InGaN QW 1002, AlGaN electron blocking layer 1006 on the GaN cap layer 1004, p-type GaN:Mg layer 1008 on the AlGaN electron blocking layer 1006, low TD densities ($<5\times10^6$ $cm^{-2}$) and a planar InGaN QW 1002 with abrupt interface 1010, 1012. Increasing a crystal quality of the QWs 612 and 620 increases the output power of the device 600; for example, the QWs 612 and 620 have the crystal quality sufficiently high to obtain the output power of more than 3.5 mW at a current of 20 mA, or more than 29.2 mW at 200 mA. FIG. 10 illustrates that the crystal quality is, or can be measured by, TDs, a planar QW and/or an abrupt interface 1012. Thus, output powers of more than 3.5 mW at a current of 20 mA can be obtained with TD densities $5\times10^6$ $cm^{-2}$ or less, or even $9\times10^9$ $cm^{-2}$ or less.

REFERENCES

The following references are incorporated by reference herein.

[1] M. Funato, M. Ueda, Y. Kawakami, T. Kosugi, M. Takahashi, and T. Mukai, Jpn. J. Appl. Phys. 45 (2006) L659.

[2] R. Sharma, P. M. Pattison, H. Masui, R. M. Farrell, T. J. Baker, B. A. Maskell, F. Wu, S. P. DenBaars, J. S. Speck, and S, Nakamura, Appl. Phys. Lett. 87, p. 231 110 (2005).

[3] H. Zhong, A. Tyagi, N. N. Fellows, F. Wu, R. B. Chung, M. Saito, K. Fujito, J. S. Speck, S. P. DenBaars, and S, Nakamura, Appl. Phys. Lett. 90, p. 233504 (2007).

[4] H. Zhong, A. Tyagi, N. N. Fellows, R. B. Chung, M. Saito, K. Fujito, J. S. Speck, S. P. DenBaars, and S, Nakamura, Electronics Letters 43 (2007).

[5] H. Sato, A. Tyagi, H. Zhong, N. Fellows, R. B. Chung, M. Saito, K. Fujito, J. S. Speck, S. P. DenBaars, and S, Nakamura, Phys. Stat. Sol. (RRL) 1, 162-164 (2007).

[6] H. Sato, R. B. Chung, H. Hirasawa, N. N. Fellows, H. Masui, F. Wu, M. Saito, K. Fujito, J. S. Speck, S. P. DenBaars, and S, Nakamura, Appl. Phys. Lett. 92, p. 221110 (2008).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A semiconductor Light Emitting Diode (LED), comprising at least:
   a n-type layer;
   a p-type layer;
   an active layer between the n-type layer and the p-type layer, wherein:
   the active layer emits light with a peak emission wavelength longer than 560 nm at a current density of at least less than 7.4 Amps per centimeter square, and
   the LED is a III-nitride based semi-polar LED.

2. The LED of claim 1, wherein the active layer further includes Indium and an emission color of the LED corresponds to yellow light.

3. The LED of claim 2, wherein:
   the LED is grown on a semipolar plane of a bulk GaN substrate, and
   the active layer is sufficiently thick, an Indium (In) composition of the active layer is sufficiently high, and a crystal quality of the active layer is sufficiently high, to emit the light with an output power of more than 3.5 mW at the current density of 7.4 Amps per centimeter square and with an External Quantum Efficiency of at least 8.2%.

4. The LED of claim 2, wherein the active layer comprises a threading dislocation density of less than $5\times10^6$ $cm^{-2}$.

5. The LED of claim 2, wherein the active layer comprises a dislocation density of less than $5\times10^6$ $cm^{-2}$.

6. The LED of claim 1, wherein the active layer includes one or more planar quantum wells comprising abrupt interfaces.

7. The LED of claim 6, wherein the quantum wells have a thickness in a range from 2 nm to 7 nm.

8. The LED of claim 1, wherein the light is emitted with an output power of more than 3.5 mW at the current density.

9. The LED of claim 8, wherein the light is emitted with an External Quantum Efficiency of at least 8.2%.

10. A multi-color LED device comprised of the LED of claim 1.

11. A white LED device comprised of the multi-color LED device of claim 10, wherein the white LED device emits white light.

12. The multi-color LED device of claim 10, wherein the white light is emitted without a phosphor.

13. The multi-color LED device of claim 10, further comprising a blue LED combined with the LED of claim 1.

14. The multi-color LED device of claim 10, further comprising at least an additional active layer between the n-type layer and the p-type layer, wherein the additional active layer emits additional light that, in combination with the light, forms white light.

15. The LED of claim 1, further comprising a transparent Indium Tin Oxide layer on the p-type layer.

16. A method of fabricating a semiconductor Light Emitting Diode (LED), comprising at least:
   depositing an n-type layer;
   depositing a p-type layer; and
   depositing an active layer between the n-type layer and the p-type layer, wherein:
   the active layer emits light with a peak emission wavelength longer than 560 nm at a current density of at least less than 7.4 Amps per centimeter square, and
   the LED is a III-nitride based semi-polar LED.

17. The method of claim 16, wherein the depositing is by Metal Organic Chemical Vapor Deposition (MOCVD) and:
   the n-type layer comprises an n-type Gallium Nitride (GaN) layer deposited on a semi-polar plane of a GaN substrate,
   the n-type GaN is grown at a temperature 10-50° C. lower than a temperature used for growth of c-plane GaN,
   the active layer:
   (1) comprises an Indium containing quantum well grown at a temperature lower than the temperature at which the n-type layer is grown,
   (2) the quantum well is grown to a thickness thicker than a thickness of c-plane nitride based light-emitting quantum well layer,
   (3) the quantum well is grown at a faster growth rate than a growth rate used for growing the c-plane nitride based light-emitting QW layer,
   the p-type layer comprises a p-type GaN layer grown on a p-type electron blocking layer, wherein the p-type electron blocking layer is grown on the active layer,
   the p-type GaN layer is grown at a temperature up to 250° C. lower than a temperature used for growth of c-plane III-nitride or GaN.

18. The method of claim 17, further comprising:
   depositing Indium Tin Oxide on the p-GaN; and
   annealing the ITO to make the ITO become transparent.

19. The method of claim 16, wherein:
   the LED is a III-nitride based semi-polar LED,
   the LED is grown on a bulk GaN substrate,
   the active layer further includes Indium, and
   the depositing is under conditions such that the active layer is sufficiently thick, an Indium (In) composition of the active layer is sufficiently high, and a crystal quality of the active layer is sufficiently high to emit the light with an output power of more than 3.5 mW at the current density and with an External Quantum Efficiency of at least 8.2%.

20. The method of claim 16, wherein the depositing is such that the active layer includes one or more planar quantum wells comprising abrupt interfaces.

21. The method of claim 16, wherein the active layer further includes Indium and an emission color of the LED corresponds to yellow light.

* * * * *